United States Patent [19]

Davenport

[11] Patent Number: 4,799,615

[45] Date of Patent: Jan. 24, 1989

[54] COLLET HOLDER

[76] Inventor: Michael L. Davenport, Rte. 6, Box 907, Leander, Tex. 78641

[21] Appl. No.: 63,064

[22] Filed: Jun. 17, 1987

[51] Int. Cl.⁴ .......................................... B23K 37/04
[52] U.S. Cl. ..................................... 228/44.7; 228/51; 228/55; 219/85 D; 269/21; 279/3
[58] Field of Search ...................... 228/44.7, 212, 218, 228/242, 51, 55; 219/85 D, 158; 269/21; 279/3

[56]  References Cited
U.S. PATENT DOCUMENTS 3,676,911  7/1972  Austin .................................. 228/44.7
4,315,128  2/1982  Matcovich et al. ............... 219/85 D Primary Examiner—Nicholas P. Godici
Assistant Examiner—Samuel M. Heinrich
Attorney, Agent, or Firm—G. Roland Love

[57] ABSTRACT

A collet holder which provides heated gas directly to and around the collet head, and prevents oxygen entrainment. The collet holder is characterized by three concentric sections. The first section receives the cartridge heater and holds the collet, providing it with a vacuum. The second section surrounds the forward portion of the first section and creates the gas turbulent flow heat exchanger. The collet extends through a discharge orifice by which the heated gas is applied to the collet head. Finally, a third shield section encases the collet holder and minimizes heat loss.

7 Claims, 4 Drawing Sheets

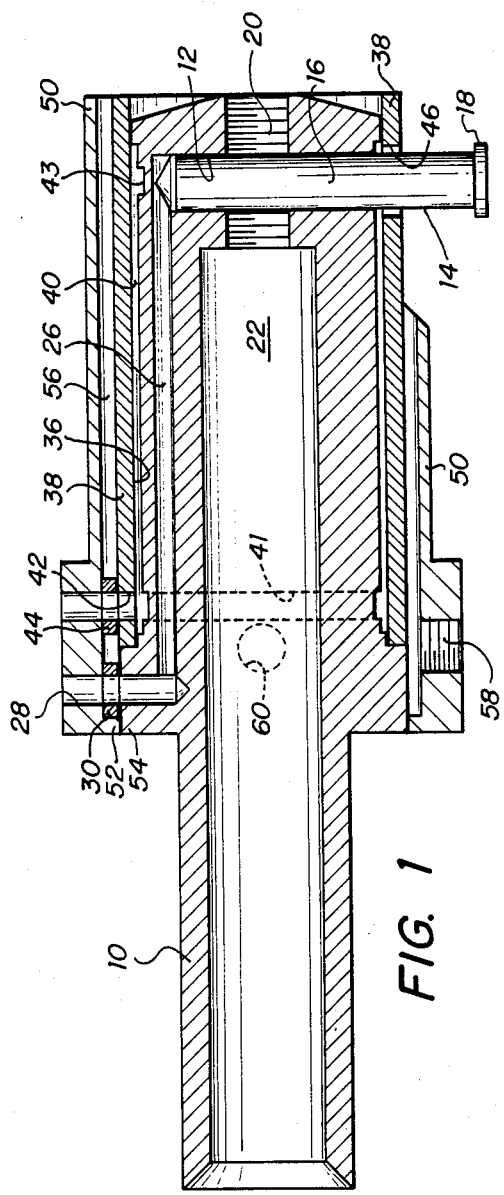
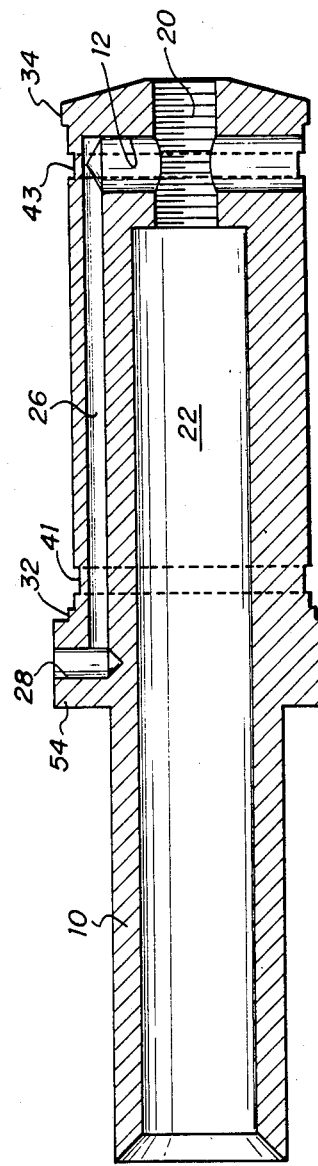
FIG. 1
FIG. 2

COLLET HOLDER

BACKGROUND OF THE INVENTION

1. Field of the Invention:

This invention is related to packaging semi-conductor chips and more particularly, but not by way of limitation, to collet holders used to hold die during brazing operation for insertion of the die into its package.

2. Description of the Prior Art:

The semi-conductor devices are brazed into their carriers and subsequently connected to the carrier leads. The collet holder provides a means of mechanically holding the collet, a means of applying a vacuum through the collet in order to hold the die in position for the brazing operation and it also provides a course of heat to the collet which is required to assist in melting the brazing alloy. The collet is made of a carbide which is a very poor conductor of heat which has forced users to add a resistance heater around the shank of the collet in order to obtain a proper brazing temperature.

Additionally, the atmosphere must not be contaminated and oxidation must be prohibited. This is typically accomplished by flooding the area with nitrogen gas, but unless the gas is preheated to brazing temperatures and unless it is applied uniformly to the area of interest in such a way as to exclude atmospheric contamination, it may interfere with the proper completion of the brazing operation.

SUMMARY OF THE INVENTION

The present invention may be briefly described as a collet holder consisting of three primary integrated pieces which together provide a traditional collet holder function while solving the problems faced by the use of a collet holder. It provides an even and adequate flow of inert gas, typically nitrogen, thereby preventing the entrainment of atmospheric gases and concommitant contamination. Additionally, the nitrogen is heated so that there is no interference with the brazing operation. A first piece holds the cartridge heater and the collet. The first piece's outside circumference acts as an inside wall of the gas chamber, more specifically a turbulent flow heat exchanger. The second piece serves as the outside wall of the gas chamber, and the third outside piece is used to control radiant heat losses. It is also part of the system providing nitrogen and vacuum to the first piece and collet.

BRIEF DESCRIPTION OF THE DRAWINGS

FIG. 1 is a sectional view of the collet holder;

FIG. 2 is a sectional view of the first internal element of FIG. 1;

DESCRIPTION OF THE PREFERRED EMBODIMENT

Figure 3:
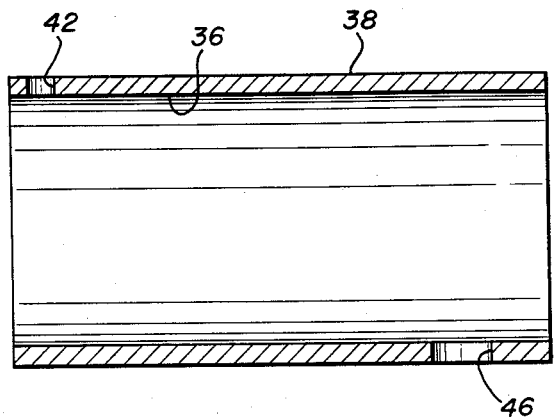
FIG. 3 is a sectional view of the middle element of FIG. 1.

With reference to FIG. 1, a preferred embodiment of the invention includes a first element 10 which holds the cartridge heater and is drilled at 12 to receive the collet 14. The collet 14 is a stem 16 with an attached head 18, both of which are hollow and through which a vacuum is provided to hold the semiconductor device.

The first element 10 is drilled and threaded at 20 so that a set screw may be used to secure the collet stem 16. The hole 20 is drilled through to the chamber 22 where the cartridge heater is located, such that the hole 20 also serves as a pusher port to reject the cartridge heater.

The vacuum is provided to the collet 14 through the drilled hole 26 to the top of the hollow stem 16. The drilled hole 26 is connected to port 28 to which vacuum lines may be provided and inserted. In the preferred embodiment the vacuum line is press fitted and sealed by an aluminum o-ring 30. This means of attachment minimizes leakage, and therefore contamination or loss of vacuum and isolates the seal from the cyclic effects of thermal expansion and contraction.

Reference to FIG. 2 also demonstrates the first element 10. Outside wall 30 and raised portions 32 and 34 which meet the inside wall 36 of the second element 38 form a gas chamber or turbulent flow heat exchanger 40. A second port 42 is provided to receive the nitrogen source lines. While nitrogen is mentioned throughout this description, and the industry typically uses nitrogen, any inert gas could be used. O-ring 44 seals the source line in place, typically a stainless steel feed tube. The o-ring 44 is typically aluminum but may also be nickel.

The introduction of inert gas into the heat exchanger chamber 40 is facilitated by the annular distribution groove 41 which prevents throttling restriction. The heat exchanger chamber 40 is proportioned to force turbulent flow thereby increasing the efficiency of heat transfer between the heated walls of the chamber and the inert gas. The heated gas exits via an annular collection groove 43 which again minimizes throttling restriction. Groove 43 empties through a toroidal discharge orifice formed by the stem 14 of the collet and the hole 46 in the wall of element 38.

The heated inert gas is thus discharged in intimate contact with the stem 14 of the collet and hereby heats the collet to brazing temperature, eliminating the need for supplemental heaters wrapped around stem 14. The intimacy of contact between the heated gas and the collet also effectively minimizes contamination by providing minimal access for the entrainment of atmospheric gases.

In the preferred embodiments, the preferred materials for the internal sections would be aluminum bronze. Nickel or any stainless steel could also be used.

Figure 4:
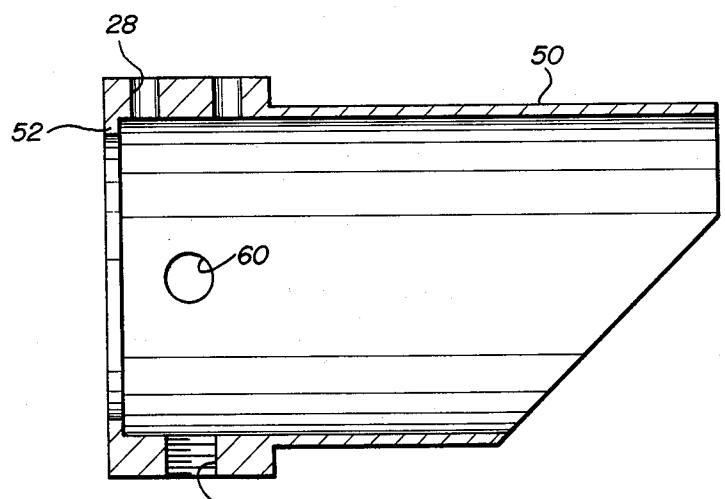
FIG. 4 is the outside shielding element.

Referring now to FIG. 4, the third concentric and outside section 50 is shown. In the preferred embodiment, this section is a polished, corrosion resistant metal, typically stainless steel type 316, which acts as a thermal shield minimizing radiant losses. Nickel or any stainless steel could also be used. This section 50 has a smaller concentric section 52 which meets projection 54 of the first section 10. An air chamber 56 is thereby forced which insulates the shield 50 from the second section 38. This arrangement also acts to assist in creating and maintaining the isolation and integrity of the seals at 30 and 44. A set screw is provided at 58 to secure the outside section 50 and compress the seals 30 and 44. Further set screws at 60 are provided to center the shield. As shown the shield 50 may be cut away to provide a better view of the collet heat 18.

The means of attaching the gas and vacuum lines minimizes surface area, and thereby radiant heat loss, while providing a seal that will be unaffected by thermal cycling. The fact that temperatures in this device are high enough to cause the loss of induced strain means that normally the sealing elements (o-rings)

would have to be designed to be compressed by unyielding members; such as an o-ring captured between a suitably thick flange and nut. Since this device must minimize surface area, massive connectors could not be used and thus the design is dependent upon the fact that the outer section, 50, remains elastic (since it is thermally insulated somewhat) and thereby retains compressive forces on the o-rings.

It must be recognized that by machining techniques, variations on the above could be accomplished particularly with regard to the chambers and attachment points of the sections. While rather specific terms have been used to describe the present invention, they are not intended nor should they be construed as a limitation upon the invention as defined by the following claims:

What is claimed is:

1. A collet holder comprising:
   a first cylindrical section which holds a cartridge heater and collet and provides a vacuum to the collet;
   a second section concentrically surrounding and attached to the first cylindrical section to form a turbulent flow heat exchanger for providing a heated gas to the collet; and including a discharge orifice through which the collet extends, thereby heating the collet and minimizing entrainment of atmospheric gases; and
   a third section concentrically surrounding the second section and attached to the rear portion of the first cylindrical section, thereby providing a heat shield to prevent radiant heat losses.

2. The collet holder of claim 1 wherein the first cylindrical section is drilled and threaded to provide a set screw for the collet and a hole for a pusher port to remove the cartridge heater.

3. The collet holder of claim 1 wherein the first cylindrical section is machined to provide a first chamber, whereby a vacuum may be directly provided to the collet.

4. The collet holder of claim 1 wherein o-rings are used inside the third shield section to secure the vacuum and gas lines to the collet holder.

5. The collet holder of claim 5 wherein the third shield section is provided with set screws to isolate the shield and compress the o-rings.

6. The collet holder of claim 1 wherein the third shield section is polished, thereby reducing radiant heat loss.

7. The collet holder of claim 1 wherein the first and second sections are aluminum bronze.

* * * * *